United States Patent
Krystad et al.

(10) Patent No.: US 10,161,995 B2
(45) Date of Patent: Dec. 25, 2018

(54) TEMPERATURE CONTROL SYSTEM AND METHOD THEREOF

(71) Applicant: MPI Corporation, Chu-pei, Hsinchu County (TW)

(72) Inventors: Helge Jacob Krystad, Chu-pei (TW); Ying-Chiao Chang, Chu-pei (TW); Yueh-Ying Lee, Chu-pei (TW)

(73) Assignee: MPI CORPORATION, Chu-Pei, Hsinchu County (TW)

( * ) Notice: Subject to any disclaimer, the term of this patent is extended or adjusted under 35 U.S.C. 154(b) by 86 days.

(21) Appl. No.: 15/264,911

(22) Filed: Sep. 14, 2016

(65) Prior Publication Data

US 2017/0082683 A1    Mar. 23, 2017

Related U.S. Application Data

(60) Provisional application No. 62/219,709, filed on Sep. 17, 2015.

(51) Int. Cl.
| | | |
|---|---|---|
| G01R 31/28 | (2006.01) | |
| F24H 9/20 | (2006.01) | |
| H05B 1/02 | (2006.01) | |

(52) U.S. Cl.
CPC ....... G01R 31/2875 (2013.01); F24H 9/2071 (2013.01); G01R 31/2862 (2013.01); H05B 1/0297 (2013.01)

(58) Field of Classification Search
CPC ............ G01R 31/2856; G01R 31/2874; G01R 31/46; G01R 31/286; G01R 31/2875; G01R 31/2877; G01N 21/332; G01N 27/23; G01N 27/123
See application file for complete search history.

(56) References Cited

U.S. PATENT DOCUMENTS

| | | | | |
|---|---|---|---|---|
| 5,205,132 A * | 4/1993 | Fu | ............ | G01R 31/2891 236/15 BB |
| 5,911,897 A * | 6/1999 | Hamilton | ............ | G01R 31/2874 219/209 |
| 7,355,428 B2 * | 4/2008 | Kabbani | ............ | G01R 31/2891 165/80.4 |
| 8,602,641 B2 * | 12/2013 | Pelrin | ............ | G01N 17/002 374/45 |

(Continued)

*Primary Examiner* — Tung X Nguyen
*Assistant Examiner* — Dominic Hawkins
(74) *Attorney, Agent, or Firm* — Birch, Stewart, Kolasch & Birch, LLP (57) ABSTRACT

A temperature control system and method are provided. The system includes a first channel, a second channel, a heating element, a DUT chamber, a converter, a first PID controller, and at least one switching regulator. The heating element is disposed downstream of the first and the second channels to heat the first air from the first channel or the second air from the second channel according to an input power so as to provide mixing air with a temperature into the DUT chamber. The converter converts an AC power to a DC power. The first PID controller provides a first input signal according to a first set point and an amount of power consumed by the heating element. The input power is adjusted by the switching regulator to drive the heating element according to the first input signal. Thus, the use of electrical power is more efficient.

15 Claims, 8 Drawing Sheets

(56) References Cited

U.S. PATENT DOCUMENTS

| | | | |
|---|---|---|---|
| 2003/0001605 A1* | 1/2003 | Jones | G01R 31/2874 324/750.09 |
| 2005/0250557 A1* | 11/2005 | Marschalkowski | G06F 1/3203 455/574 |
| 2006/0164111 A1* | 7/2006 | Lopez | G01K 1/16 324/750.03 |
| 2008/0074095 A1* | 3/2008 | Telefus | H02M 1/10 323/282 |
| 2008/0202312 A1* | 8/2008 | Zane | G09G 3/342 84/297 R |
| 2010/0039117 A1* | 2/2010 | Jacobs | G01R 31/311 324/537 |
| 2010/0327891 A1* | 12/2010 | Hobbs | G01R 31/2874 324/750.03 |
| 2013/0068442 A1* | 3/2013 | Di Stefano | F25B 49/02 165/253 |
| 2013/0091876 A1* | 4/2013 | Weng | G05D 23/19 62/64 |
| 2013/0285686 A1* | 10/2013 | Malik | G01R 31/2875 324/750.05 |
| 2014/0117955 A1* | 5/2014 | Zoso | H02M 3/157 323/271 |
| 2014/0253157 A1* | 9/2014 | Dean | G01R 1/44 324/750.09 |
| 2015/0130273 A1* | 5/2015 | Govindaraj | G01R 31/028 307/10.1 |
| 2015/0309112 A1* | 10/2015 | Goh | G01R 31/2874 324/750.08 |

\* cited by examiner

TEMPERATURE CONTROL SYSTEM AND METHOD THEREOF

CROSS-REFERENCE TO RELATED APPLICATIONS

This non-provisional application claims priority under 35 U.S.C. § 119(e) to U.S. Provisional Patent Application No. 62/219,709, filed on Sep. 17, 2015, the entire contents of which are hereby incorporated by reference.

BACKGROUND

Technical Field

The instant disclosure relates to temperature control, in particular to a temperature control system and method with improved electrical power management.

Related Art

In the field of thermal management of a liquid or gas flow, temperature control via a heating device has been around for a long time. The power requirement is variable, depending on the amount of flow, desired temperature range, and the temperature change rate. Heating elements are normally resistance based, typically using tungsten wire to provide the resistance element. The liquid or gas typically flows past the heating wire, and energy is then transferred to the medium, by passing current through the wire, thus causing it to heat up. Many commercial appliances of heaters require direct current (DC) power. Hence, normally an alternating current (AC) to DC converter is used to distribute the input voltage to the point of load (POL).

The heating wire has a non-constant resistance characteristic: typically the resistance increases with temperature. The non-constant resistance characteristic makes precise temperature control difficult, since the typical way of controlling this type of heater is to turn the heater on or off, using a fixed voltage, AC or DC, thus controlling the duty cycle of the current. This type of temperature control causes undesired fluctuations in temperature and electrical noise in the system. In addition, the power factor of the supplied power is also fluctuated. These fluctuations are sometimes referred to as flicker noise, and there are limits to how much flicker noise is allowed, depending on which international standard the system has to operate within. Different locations also have varying power available, and fluctuations caused by other equipment attached to the same power can also cause fluctuations in temperature of the liquid or gas.

SUMMARY

In view of the above, it is desirable to provide a control system that is independent of the supplied system voltage, and can reduce flicker noise and improve the power factor of the temperature control.

The instant disclosure provides a temperature control system for use in a closed loop environment to control the temperature of a device under test (DUT). An embodiment of the temperature control system comprises a first channel, a second channel, a heating element, a DUT chamber, a boost converter, a first proportional-integral-derivative (PID) controller, and at least one switching regulator. The first channel is connected to a first valve to receive a first air from the first valve. The second channel is connected to a second valve to receive a second air from the second valve. The heating element is disposed downstream of the first channel and the second channel to heat at least one of the first air and the second air according to an input DC power so as to provide a mixing air with a temperature. The DUT chamber is disposed downstream of the heating element to receive the mixing air and configured to accommodate the DUT. The boost converter is configured to receive an AC power and provide a DC power. The first PID controller is configured to provide a first input signal according to a first measurement signal of the heating element and a first set point. The first measurement signal is indicative of the amount of power consumed by the heating element, and the first set point is indicative of a desired input power to be supplied to the heating element. The switching regulator is coupled to the boost converter and the first PID controller to receive the first input signal and provide the input power to the heating element.

DETAILED DESCRIPTION

Figure 1:
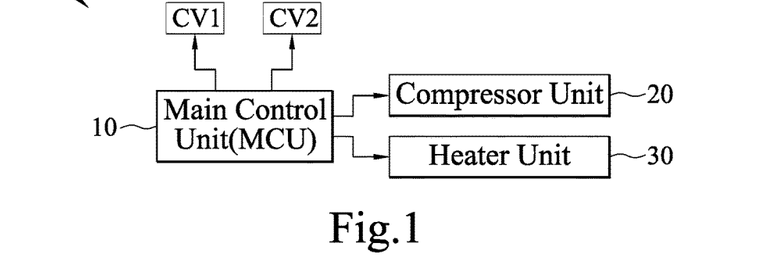
FIG. 1 illustrates a functional block diagram of a temperature control system for one embodiment of the instant disclosure.

A temperature control system 100 for one embodiment of the instant disclosure is illustrated in FIG. 1, in order to provide thermal management for a device of interest. This device is referred to as the device under test, or DUT. The temperature control system 100 comprises a main control unit (MCU) 10, a compressor unit 20, and a heater unit 30. The MCU 10 can be a processor with multiple I/O terminals which are respectively coupled to the first valve CV1, the second valve CV2, the compressor unit 20 and the heater unit 30, such that can send signals to the first valve CV1, the second valve CV2, the compressor unit 20, and the heater unit 30, and receive signals from the first valve CV1, the second valve CV2, the compressor unit 20, and the heater unit 30. The MCU 10 can control the first valve CV1 to regulate an amount of the cold air (or treated air) flowing into the first channel 361, and controls the second valve CV2 to regulate an amount of the ambient air flowing into the second channel 362. The MCU 10 is capable of controlling the temperature of the first air before the first air flows into the first channel 361, and capable of controlling the temperature of the mixing air according to the input power, the amount of the second air, and the amount and the temperature of the first air. For example, if the input power is fixed, and the temperature of the mixing air is needed to be lower down, then the MCU 10 can control the amount of the first air to be increased and/or control the temperature of the first air to be lower down before it flows into the first channel 361. Alternatively, if the temperature of the mixing air is needed to be increased, then the MCU 10 can control the temperature of the first air to be increased before it flows into the first channel 361. And if the input power is not fixed, and if the temperature of the mixing air is needed to be increased, the MCU 10 may control the temperature of the first air to be increased, the amount of the first air to be decreased, the amount of the second air to be increased, and/or the input power to be increased, and the MCU 10 may choose an energy efficient way or a fast-achieved way according to the environmental conditions or the request of the user. And the input power may be determined according to the desired temperature of DUT or the heater unit 30. The MCU 10 can send control signals selectively or simultaneously to the compressor unit 20 and the heater unit 30 depending on the desired application mode. One type of applications is thermal shock testing, which involves rapid heating from a steady state to elevated control temperatures in order to maximize testing speed, thereby reducing cost per test. For such situation, accurate temperature control is needed to provide reliable and repeatable test results. For example, the ability to prevent overshooting of control temperatures while providing efficient use of power budgets is one of the important topics of interest.

Figure 2:
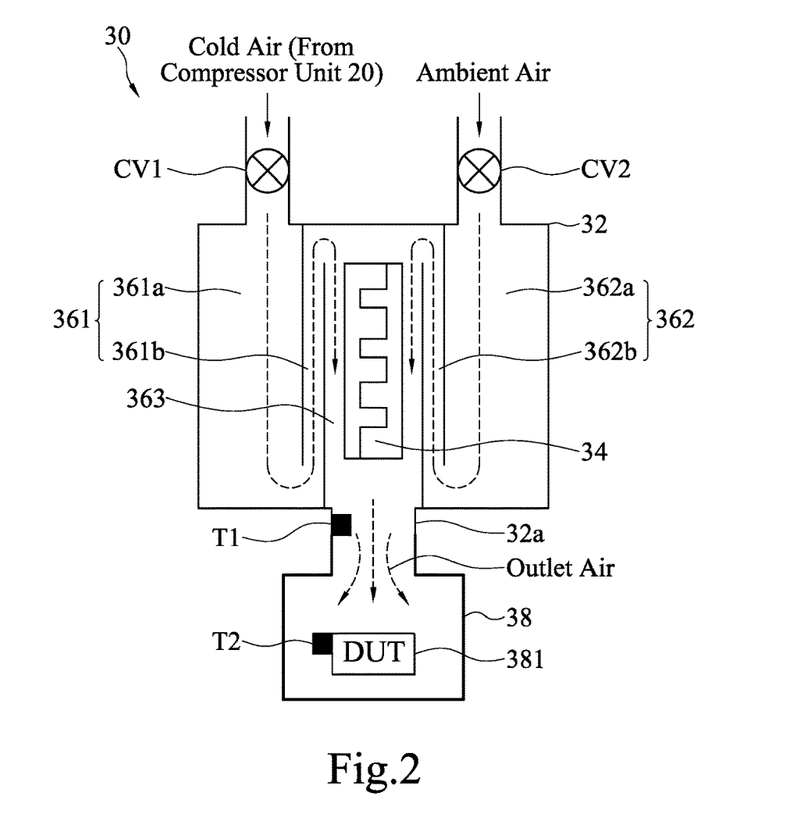
FIG. 2 illustrates a schematic view for an embodiment of a heater unit for the temperature control system of the instant disclosure.

In conjunction with FIG. 1, a schematic view showing the heater unit 30 is illustrated in FIG. 2. As can be seen, the heater unit 30 includes a mixing chamber 32, a heating element 34, first channel 361, second channel 362, heating channel 363, and a DUT chamber 38. The mixing chamber 32 is capable of receiving cold air and ambient air separately for convective heating. The cold air is delivered to the mixing chamber 32 from the compressor unit 20, and the ambient air can be provided through an air filter (not shown). Preferably, the mixing chamber 32 is furnished with a first valve CV1 and a second valve CV2, in order to regulate the amount of cold and ambient air entering the mixing chamber 32 respectively. The first channel 361 includes an outer channel 361a and an inner channel 361b. The outer channel 361a of the first channel 361 is connected to the first valve CV1 to receive cold air generated from compressor unit 20. The second channel 362 includes an outer channel 362a and an inner channel 362b. The outer channel 362a of the second channel 362 is connected to the second valve CV2 to receive ambient air from the second valve CV2. The DUT chamber 38 is utilized to accommodate a DUT 381 so that the DUT 381 can undergo thermal treatment in a confined space. Specifically, the DUT chamber 38 receives outlet air from an outlet 32a of the mixing chamber 32 and the outlet air may directly or indirectly flow past the DUT 381. Of course, the DUT chamber 38 has another outlet (not shown) for exhausting the outlet air.

In some embodiments, the received cold air from CV1 flows in the outer channel 361a in a first direction and flows in the inner channel 361b in a second direction substantially opposite to the first direction. Likewise, the received ambient air from CV2 flows in the outer channel 362a in the first direction and flows in the inner channel 362b in the second direction substantially opposite to the first direction.

In some embodiments, the mixing chamber 32 is in a round shape and the flow channels 36 are in a ring shape. In addition, the heating element 34 is disposed in the heating channel 363. FIG. 2 is a schematic sectional view and illustrates the internal structure of the mixing chamber 32. The outer channel 361a of the first channel 361 and the outer channel 362a of the second channel 362 can be integrated as an outer ring channel, and the inner channel 361b of the first channel 361 and the inner channel 362b of the second channel 362 can be integrated as an inner ring channel.

Therefore, the cold air from CV1 may encounter the ambient air from CV2 before they flow into the heating channel 363 in a third direction substantially opposite to the second direction.

In some embodiments, the mixing chamber 32 has several outlets 32a which are capable of individually connecting to several DUT chambers 38. More than one DUT chambers 38 can receive the outlet air from the outlets 32a at the same time. Of course, it is also allowed to make the DUT chambers 38 receive the outlet air from the outlets 32a one at a time.

The heating element 34 may be a coiled structure that produces heat as electricity passes through the element and encounters resistance. The heating element 34 could be made of metal, ceramic, or composite material, but not limited thereto. Based on convection, as the cold and ambient air are circulated through the channels 36 and past the heating element 34, the air current absorbs the thermal energy generated by the heating element 34 and exits the mixing chamber 32 at an elevated temperature to heat the DUT 381 within the DUT chamber 38.

Based on the user preferences, the MCU 10 is capable of selectively or simultaneously sending commands to drive the compressor unit 20 and the heater unit 30. In other words, the MCU 10 can manage the amount of electrical power to be supplied to respective units 20, 30. For example, to heat treat the DUT 381, both the compressor and heater units 20, 30 can be powered up to provide hot air for heating. But for a cooling operation, the compressor unit 20 may be turned on without activating the heater unit 30, such that the DUT 381 may be exposed to cold air for cooling. To determine which activation mode is best suited for use, some factors for consideration may be, but not limited to, flow rates or amounts of the cold and ambient air, the desired outlet temperature of the mixing chamber 32, the desired DUT temperature, and total power consumption. With regards to the abovementioned factors, the outlet temperature of the mixing chamber 32 and the DUT temperature can be measured by an outlet temperature sensor T1 and a DUT temperature sensor T2, respectively.

Figure 3:
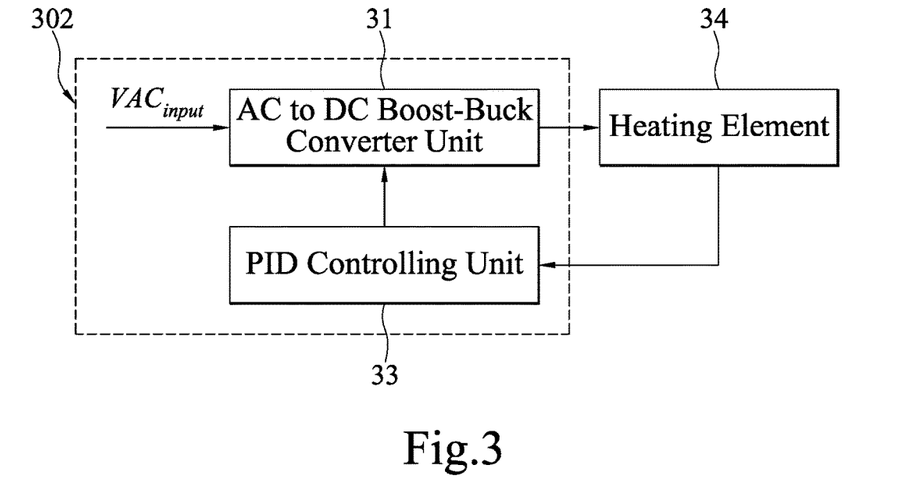
FIG. 3 illustrates a functional block diagram of a control circuit of the heater unit.

Now referring to FIG. 3, which illustrates a functional block diagram showing a control circuit 302 of the heater unit 30 for one embodiment of the instant disclosure. The control circuit 302 comprises an AC to DC boost-buck converter unit 31, and a proportional-integral-derivative (PID) controlling unit 33. The AC to DC boost-buck converter unit 31 can receive an AC voltage from the mains, which can supply 120V AC or 240V AC, but not limited thereto. Then, the AC to DC boost-buck converter unit 31 can convert the AC power to a DC power and regulates its voltage level according to an input signal from the PID controlling unit 33. The boost-buck converter unit 31 makes the regulated voltage independent over a large input range and removes fluctuations on the AC input voltage, and therefore reduces the flicker noise. A typical voltage which a nominal 230V AC system can provide would be around 400V DC. This regulated DC power is then supplied to the heating element 34, which provides a measured output signal back to the PID controlling unit 33 via at least one sensor for feedback analysis and control (to be discussed later).

Figure 4:
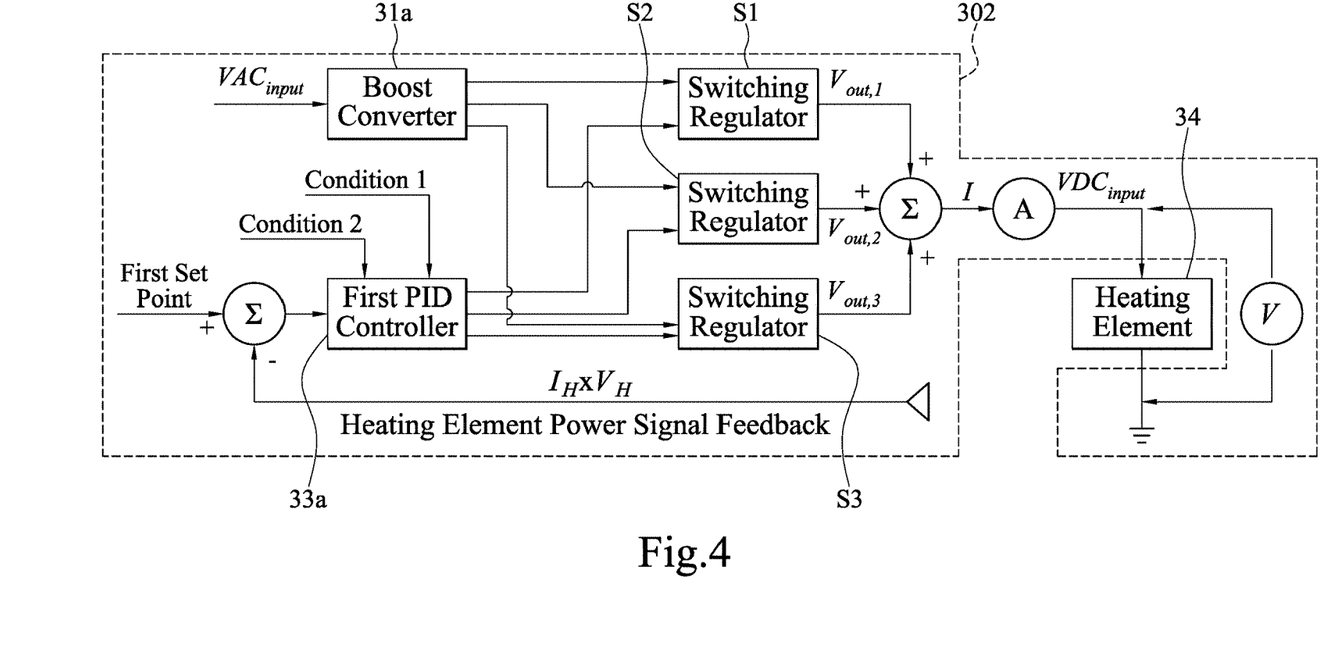
FIG. 4 illustrates a first embodiment of the control circuit.

Next, based on FIG. 3, FIG. 4 shows a circuit diagram that further explains the control circuit 302. That is, the AC to DC boost-buck converter unit 31 comprises an AC to DC boost converter 31a and at least one switching regulator which may be controlled by MCU 10. The number of switching regulators used depends on total power required, and the resolution required in the temperature control. For exemplary purpose, three switching regulators are provided for the instant embodiment and are referred to as a first switching regulator S1, a second switching regulator S2, and a third switching regulator S3. However, the number of the switching regulator is not limited thereto. The PID controlling unit 33 comprises a first PID controller 33a, but it should be noted that more than one PID controller may be used as will be explained later. The switching regulators S1, S2, S3 are of buck type regulators for stepping voltages down. The basic working components of a switching regulator include an active switch controlled by an integrated circuit, a rectifier, and filter elements. The heating element 34 may have a power rating of 3000-3500 W. The circuit also includes an ammeter A and a voltmeter V to measure the electric current in the circuit and voltage across the heating element 34, respectively.

For this embodiment, the AC to DC boost converter 31a can take an input AC power and convert it to a DC power at an elevated voltage level. As a requirement by the load (i.e., the heating element 34) for the DC power, the converter 31a acts as a first component for keeping the DC voltage within certain boundaries. In addition, the converter 31a also protects the DC side from irregularities in the voltage/current on the AC side. For the instant embodiment, the converter 31a can output a voltage level ranging from 380-400 VDC.

The first PID controller 33a is a power control loop feedback mechanism, where the first PID controller 33a can provide first input signals to respective switching regulators S1, S2, S3. The first input signals are based on the difference between a first measurement signal and a first set point. This difference is also referred to as a first error. For the instant embodiment, the first measurement signal is produced by the measurement of real power consumed by the heating element 34. The measurement of real power can be obtained by the ammeter A and the voltmeter V, where the ammeter A measures the electrical current $I_H$ in the circuit, while the voltmeter measures the DC voltage $V_H$ across the heating element 34. In other words, the ammeter A is an electric current sensor configured to provide a current sensing signal, and the voltmeter is a voltage sensor configured to provide a voltage sensing signal. Then, since electric power is the product of current and voltage (i.e., $P_H = I_H \times V_H$), the measurement of the real power consumed by the heating element 34 can be obtained. That is to say the first measurement signal is generated from the current sensing signal and the voltage sensing signal. Meanwhile, the first set point is the desired input power to be supplied to the heating element 34. For example, this first set point can be given by the aforementioned MCU 10 and stored in the memory of the first PID controller 33a. Actually, the actual input power the heating element 34 needs is related to the desired temperature of DUT 381 or the desired outlet temperature of the mixing chamber 32, and if we know the desired temperature of DUT 381 or the desired outlet temperature of the mixing chamber 32 or other locations, we can know approximately the desired input power the heating element 34 needs to heat the mixing air. Therefore, we can calculate the desired input power according to the desired temperature in advance. In some embodiments, a mapping table showing the desired input power corresponding to the desired temperature can be made and stored in MCU 10, such that the desired input power could be quickly determined. And if a user sets a desired temperature, the desired input power information needed can be obtained from the table immediately. In some embodiments, if more information is given to the MCU 10 in advance, the desired input power information provided to the PID controller 33a can be more accurate. The extra information can be selected from the amount of the second air, the temperature of the second air, the amount of the first air, and the temperature of the first air. In some embodiments, a mapping table showing the desired input power corresponding to the desired temperature and the extra information can be made and stored in MCU 10, such that the desired input power information could be quickly determined. For example, if the real power consumed by the heating element 34 is lower than the desired input power to be supplied to the heating element 34, the input power may be increased accordingly.

The previously mentioned first input signals can be provided selectively by the first PID controller 33a to the switching regulators S1, S2, and S3, in order to activate selected or all of the regulators S. For example in one embodiment, the first PID controller 33a can turn on the first and second switching regulators S1, S2 and turn off the third switching regulator S3, during a first interval of a period of a switching cycle. Then during a second interval of the same period of the switching cycle, the second and third switching regulators S2, S3 can be turned on and the switching regulator S1 can be turned off. During a third interval of the same period of the switching cycle, the first PID controller 33a can turn on the first and third switching regulators S1, S3 and turn off the second switching regulator S2. In another embodiment, the first PID controller 33a may be configured to turn on all of the switching regulators during the entire switching cycle. If necessary, the number of intervals and switching configurations can be adjusted as necessary to provide the desired input voltage for driving the heating element 31. After one or more switching regulator has been activated by the first input signal, the activated switching regulator can receive an input voltage from the converter 31a and provide a stepped down voltage in accordance to the first error (i.e., the difference between the first measurement signal and the first set point).

For the switching regulators S1, S2, and S3, the first switching regulator S1 may be configured to provide a first output voltage $V_{out,1}$, the second switching regulator S2 may be configured to provide a second output voltage $V_{out,2}$, and the third switching regulator S3 may be configured to provide a third output voltage $V_{out,3}$, with each of the voltages being different from one another. For the instant embodiment, the switching regulators S1, S2, S3 are arranged in a parallel manner to perform the step-down task. For example, the step size for the switching regulators S1, S2, S3 may be 1 W, 5 W, and 30 W, respectively. If the target input power to the heating element 34 is 3126 W, the switching regulators S1, S2, and S3 can provide an input power of 1 W, 5 W, and 3120 W, respectively. Then, the respective voltages can be summed via an adder Σ to provide a final input power of 3126 W to the heating element 34. In some embodiments, a protection mechanism could be added to the temperature control system 100. For example, if the max power MCU 10 can provide is X, the power consumed by compressor unit 20 is Y, and the power consumed by heart unit 30 is Z, then a limiting condition (condition 1 shown in FIG. 4) of Z must equal or smaller (X-Y) can be set in the First PID controller 33a, such that the temperature control system 100 will not be over-loaded.

Thus, by utilizing the boost converter 31a, the first PID controller 33a, and the switching regulators S1, S2, S3, the resulting input power to the heating element 34 can be controlled more accurately, which means the power factor of an installation (i.e., heating element 34) can be improved.

Figure 5:
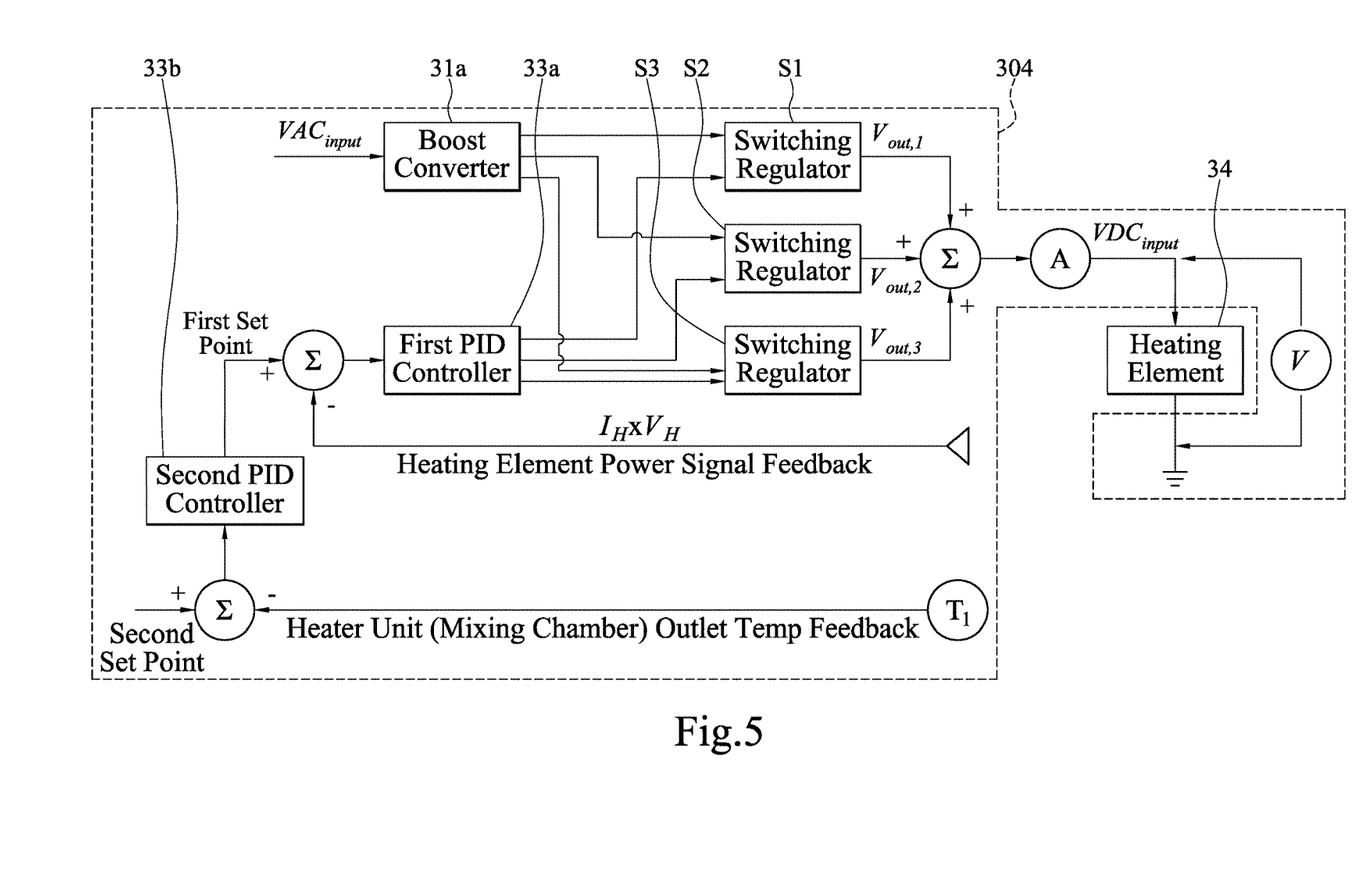
FIG. 5 illustrates a second embodiment of the control circuit.

Furthermore, in a second embodiment of the instant disclosure, a control circuit 304 further comprises a second PID controller 33b and an outlet temperature sensor T1 as shown in FIG. 5. The second PID controller 33b is coupled to the first PID controller 33a. In particular, the second PID controller 33b provides a second input signal as the first set point for the first PID controller 33a. The second input signal is based on the difference between a second measurement signal and a second set point. For the instant embodiment, the second measurement signal is produced by the measurement of the outlet temperature of the mixing chamber 32 of the heater unit 30. The measurement can be obtained by the outlet temperature sensor $T_1$ coupled to the mixing chamber 32. Meanwhile, the second set point refers to the desired outlet temperature of the mixing chamber 32. For example, the corresponding powers of the measurement of the outlet temperature of the mixing chamber 32 and the desired outlet temperature and their power difference can be obtained from a table, and they can be provided to the first PID controller 33a. For example, if the outlet temperature of the mixing chamber 32 is lower than the desired outlet temperature of the mixing chamber 32, then the input power may be increased with further consideration of the real power consumed by the heating element 34 and the corresponding powers of the measured temperature and the desired temperature. The above configuration represents a cascaded PID control loops, with the first PID controller 33a controlling the inner or secondary control loop, while the second PID controller 33b controlling the outer or primary control loop.

Figure 6:
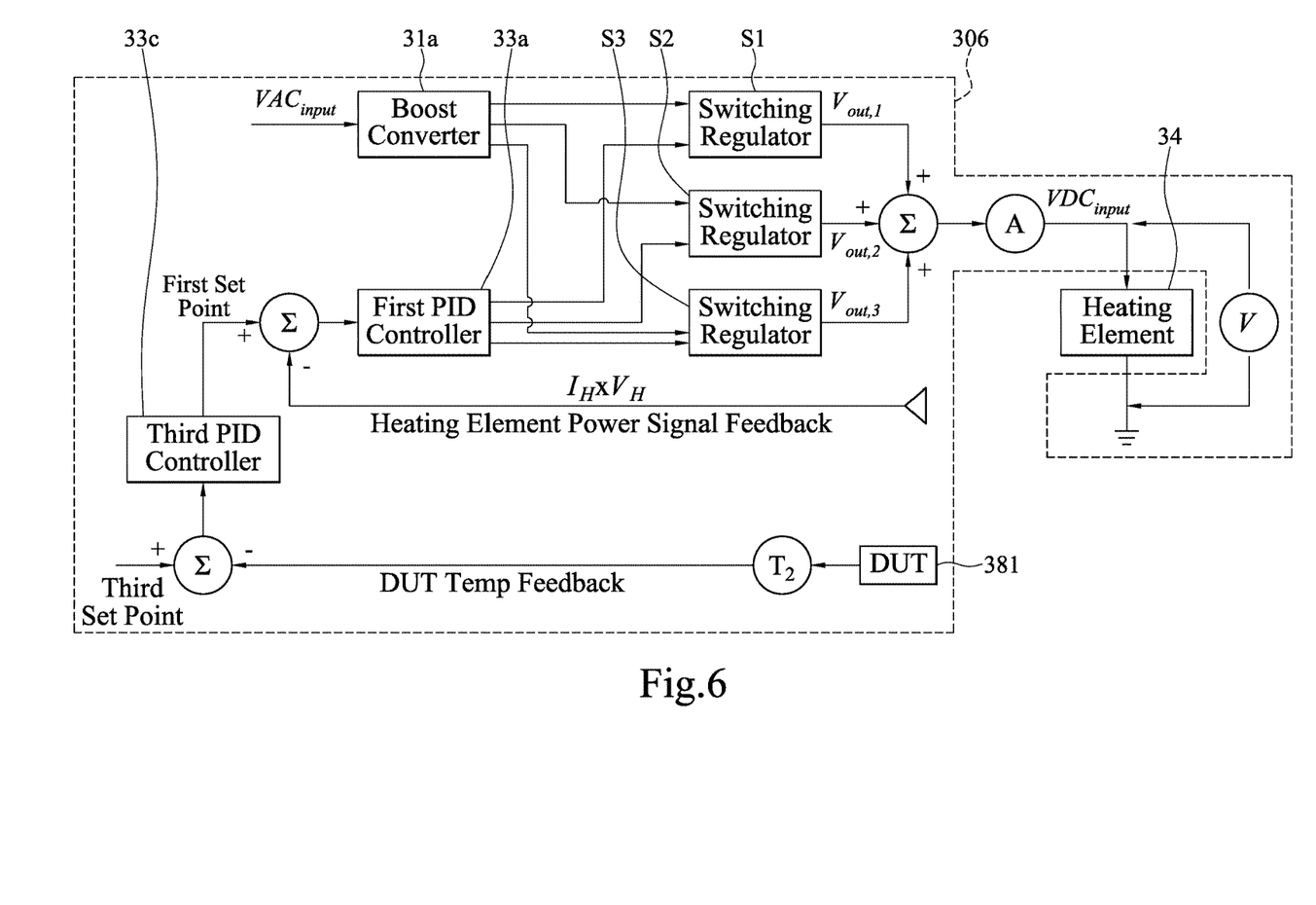
FIG. 6 illustrates a third embodiment of the control circuit.

Another example of the instant disclosure is shown by a third embodiment of a control circuit 306 in FIG. 6. Also adopting the cascade control scheme, the system 306 further includes a third PID controller 33c and a DUT temperature sensor T2. Like the previous embodiment, the third PID controller 33c is coupled to the first PID controller 33a. In particular, the third PID controller 33c provides a third input signal as the first set point for the first PID controller 33a. The third input signal is based on the difference between a third measurement signal and a third set point. For the instant embodiment, the third measurement signal is produced by the temperature measurement of the DUT, where the measurement can be obtained by the DUT temperature sensor $T_2$ coupled to a DUT 381. The third set point refers to the desired temperature of the DUT 381 and can be given by the user. For example, the corresponding powers of the temperature measurement of the DUT 381 and the desired temperature of the DUT 381 and their power difference can be obtained from a table, and they can be provided to the first PID controller 33a.

Figure 7:
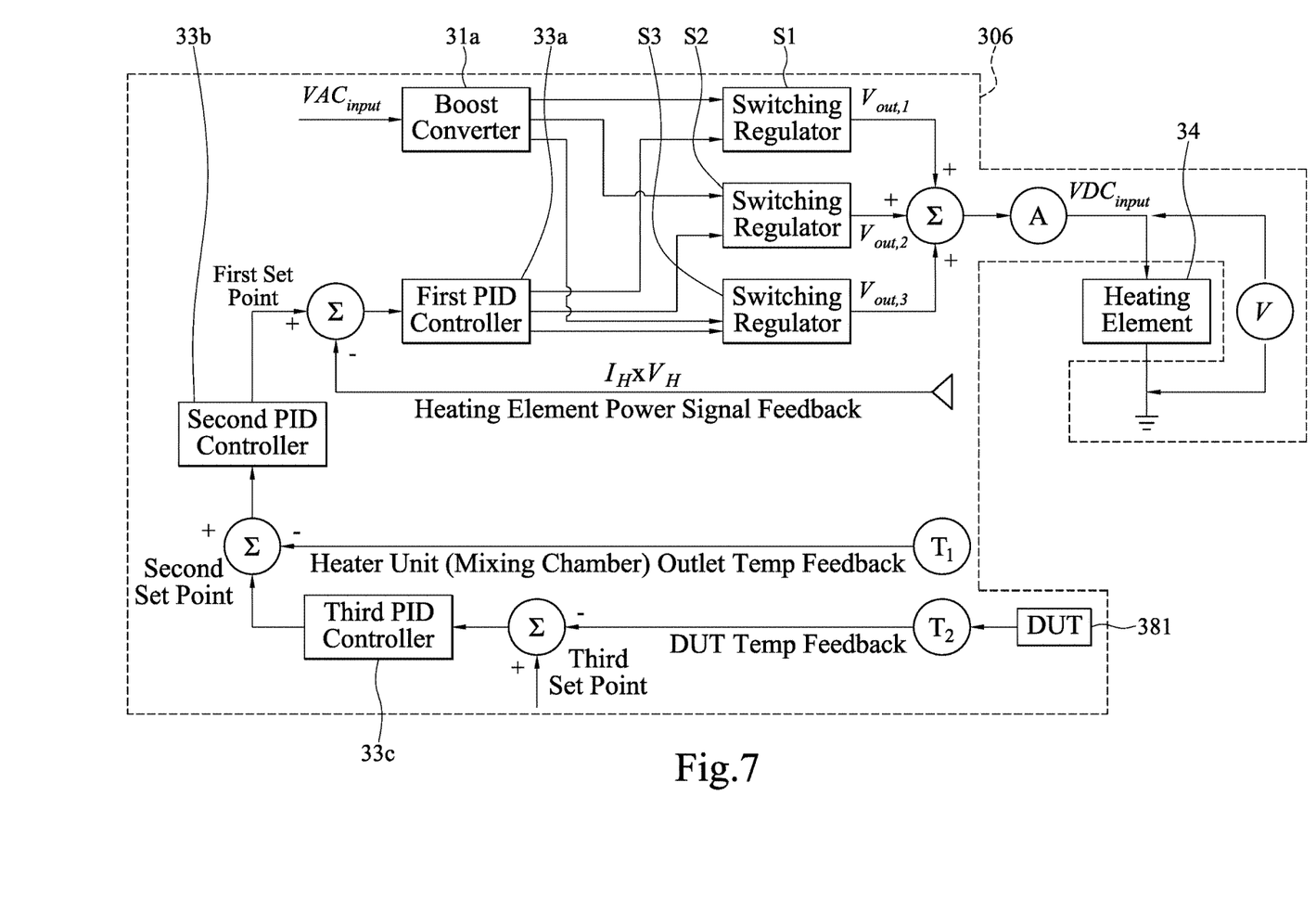
FIG. 7 illustrates a fourth embodiment of the control circuit.

In a fourth embodiment as shown in FIG. 7, a control circuit 308 incorporates both the second PID controller 33b and third PID controller 33c. That is the third PID controller 33c is coupled to the second PID controller 33b, which is coupled to the first PID controller 33a. The third PID controller 33c provides the third input signal as the second set point for the second PID controller 33b, and the second PID controller 33b provides the second input signal as the first set point for the first PID controller 33a. The characteristics of the second and third input signal have already been explained in previous paragraphs, thus not further elaboration will be given here. Based on FIGS. 5-7, these multi-looped circuits provide alternative temperature control strategies. It should be noted that additional PID controller may be added depending on a user preference. For example, another PID controller may be utilized to control the heating process according to the mass flow rate of the working fluid (e.g., cold/ambient air).

Figure 8:
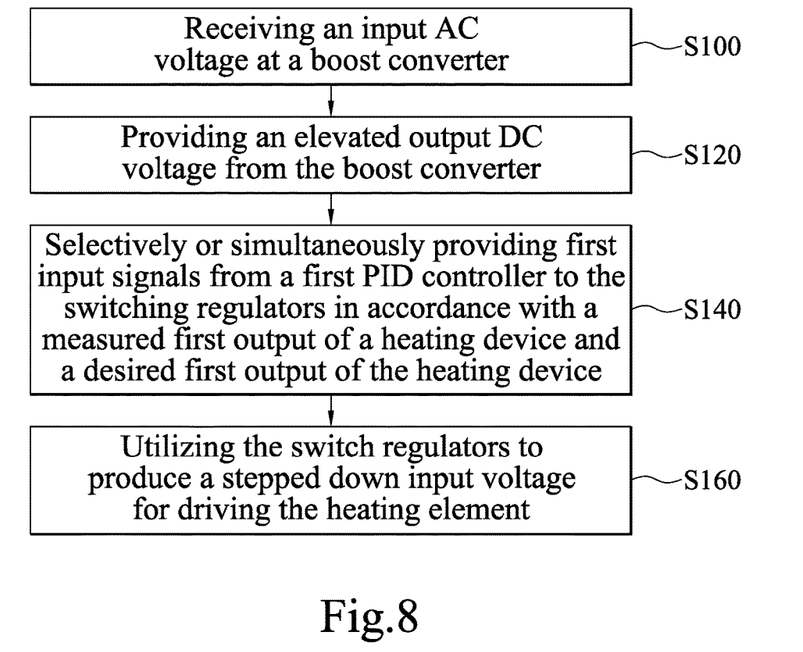
FIG. 8 illustrates a flowchart of a temperature control method for one embodiment of the instant disclosure.

Based on the control circuit 302, a corresponding temperature control method is shown with reference to FIG. 8. In step S100, the input AC voltage is received by the boost converter 31a. In step S120, the boost converter 31a provides an output DC voltage at an elevated level. In step S140, the first input signals are selectively or simultaneously provided by the first PID controller 33a to the switching regulators S1, S2, and S3, in accordance with the first measurement signal and the first set point. Then, in step S160, the switch regulators S1, S2, S3 are utilized to produce the stepped down input DC voltage for driving the heating element 34.

Figure 9:
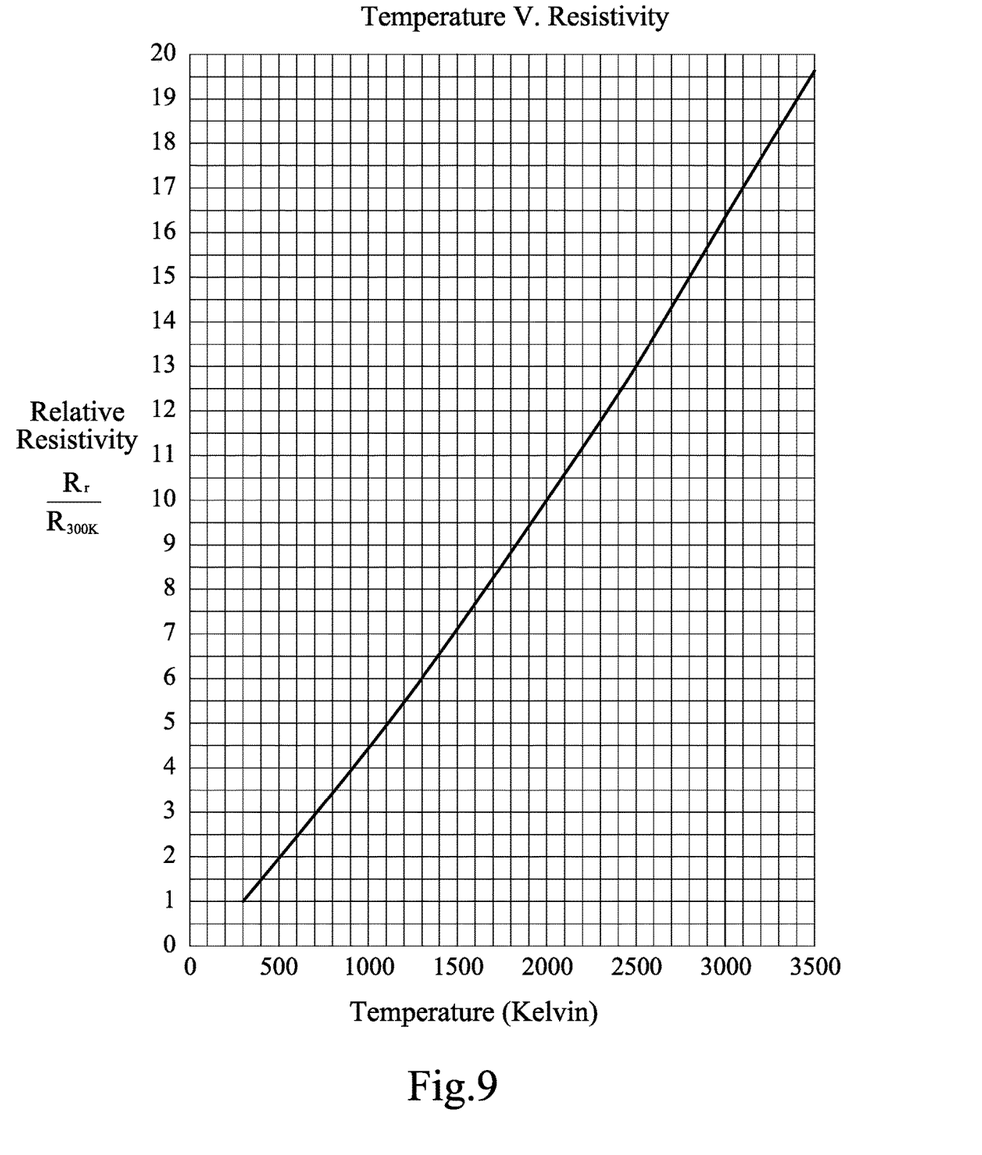
FIG. 9 illustrates the resistivity of a tungsten wire varies with temperature linearly.

The switching regulators in the disclosure may have different current capabilities, thus providing better resolution of the power control, allowing linear control of the power to the heater over a wide range. The voltage and the current supplied to or consumed by the heating element 34 can be measured. These measurements are then used to calculate the resistance of the heating element dynamically, and also used to calculate the actual power dissipated in the heating element. The MCU 10 may then adjust the amount of energy transferred to the air, thus linearizing the power control. The resistance measurement may be then used to limit the power applied to the heating element, since the resistance is related to the temperature of the heating element 34 (for example, heating wire). The resistivity of a heating wire (for example tungsten wire) increases with the temperature of itself, and the relationship between the resistivity and the temperature is approximately linear as shown in FIG. 9. The resistance of the heating wire can be calculated by measuring the voltage (V) across the heating wire and the current (I) flowing through it, and thereby the resistivity of the heating wire can be obtained by the equation $R=V/I=\rho \cdot L/A$, where R, $\rho$, L, A are the resistance, resistivity, length, and sectional area of the heating wire respectively. Therefore, a limiting condition (condition 2 shown in FIG. 4) of a cut-off resistivity can be set in the First PID controller 33a. Once the resistivity of the heating wire reaches the cut-off resistivity is detected, then the power is cut off or reduced to prevent the heating element 34 from being over loaded. In addition, this allows the MCU 10 to monitor the heating element 34 over a length of time. The occurrence of voltage overshoot can be minimized to protect the heating element 34 from operating outside of its safe temperature range, thus provide increased lifetime of the heating element 34. The MCU 10 may also control the temperature changing rate, which reduces fluctuation in temperature, and also contributes to less flicker noise.

Based on the abovementioned temperature control system 100 and method thereof for the instant disclosure, the power supply to a heating installation can be better controlled to improve the power factor, such that the electrical power can be used more efficiently. The abovementioned temperature control system 100 and method can be used for different sizes of heating elements, and also to control multiple heating elements in the same system. The MCU 10 may also measure the AC input voltage and current, and the pre-regulator voltage and current supplied to the switching regulators. In addition, the temperature of critical components in the MCU 10 is measured. These measurements can be used to make sure that the MCU 10 operates within safe operating conditions, and can be used to shut the MCU 10 down in case of component failure.

While the instant disclosure has been described in connection with what is presently considered to be the preferred examples, it is to be understood that the instant disclosure is not limited to the disclosed examples, but on the contrary, is intended to cover various modifications and equivalent arrangements included within the spirit and the scope of the instant disclosure.

What is claimed is:

1. A temperature control system for a device under test (DUT), comprising:
   a first channel, connected to a first valve to receive a first air from the first valve;
   a second channel, connected to a second valve to receive a second air from the second valve;
   a heating unit disposed downstream of the first channel and the second channel, wherein the heating unit comprises a heating element and a mixing chamber, the heating element is located in the mixing chamber, and the heating unit is adapted to heat a mixing of the first air and the second air with an input power to provide a mixing air with a temperature;
   a DUT chamber, disposed downstream of the heating element to receive the mixing air and configured to accommodate the DUT;
   a boost converter, configured to convert an alternating current (AC) power to a direct current (DC) power;
   a first proportional-integral-derivative (PID) controller, configured to provide a first input signal according to a difference between a first measurement signal of the heating element and a first set point, wherein the first measurement signal is indicative of an amount of power consumed by the heating element, and the first set point is indicative of a desired input power to be supplied to the heating element;
   at least one switching regulator, coupled to the boost converter to receive the DC power from the converter and coupled to the first PID controller to receive the first input signal, and configured to adjust the input power to the heating element; and
   an outlet temperature sensor and a second PID controller, wherein the outlet temperature sensor is configured to provide a second measurement signal indicative of a current outlet temperature of the mixing chamber, and the second PID controller is configured to provide a second input signal as the first set point according to a difference between the second measurement signal and a second set point indicative of a desired outlet temperature of the mixing chamber.

2. The system according to claim 1, further comprising an electric current sensor and a voltage sensor, wherein the electric current sensor is configured to provide a current sensing signal indicative of a current supplied to the heating element, and the voltage sensor is configured to provide a voltage sensing signal indicative of a voltage applied to the heating element, and wherein the first measurement signal is generated in accordance with the current sensing signal and the voltage sensing signal.

3. The system according to claim 1, further comprising a DUT temperature sensor and a third PID controller, wherein the DUT temperature sensor is configured to provide a third measurement signal indicative of a current temperature of the DUT, and the third PID controller is configured to provide a third input signal as the second set point according to a difference between the third measurement signal and a third set point indicative of a desired temperature of the DUT.

4. The system according to claim 1, wherein the second air is an ambient air which is filtered, and the first air is treated by a compressor unit before flowing into the first channel.

5. The system according to claim 4, further comprising:
   a main control unit, coupled to the first valve and the second valve, wherein the main control unit controls the first valve to regulate an amount of the first air flowing into the first channel, and controls the second valve to regulate an amount of the second air flowing into the second channel.

6. The system according to claim 5, wherein the main control unit controls a temperature of the first air before the first air flows into the first channel and controls the temperature of the mixing air according to the input power, the amount of the second air, and the amount and the temperature of the first air.

7. A temperature control system for a device under test (DUT), comprising:
   a first channel, connected to a first valve to receive a first air from the first valve;
   a second channel, connected to a second valve to receive a second air from the second valve;
   a heating element, disposed downstream of the first channel and the second channel to heat a mixing of the first air and the second air with an input power to provide a mixing air with a temperature;
   a DUT chamber, disposed downstream of the heating element to receive the mixing air and configured to accommodate the DUT;
   a boost converter, configured to convert an alternating current (AC) power to a direct current (DC) power;
   a first proportional-integral-derivative (PID) controller, configured to provide a first input signal according to a difference between a first measurement signal of the heating element and a first set point, wherein the first measurement signal is indicative of an amount of power consumed by the heating element, and the first set point is indicative of a desired input power to be supplied to the heating element;
   at least one switching regulator, coupled to the boost converter to receive the DC power from the converter and coupled to the first PID controller to receive the first input signal, and configured to adjust the input power to the heating element; and
   a DUT temperature sensor and a third PID controller, wherein the DUT temperature sensor is configured to provide a third measurement signal indicative of a current temperature of the DUT, and the third PID controller is configured to provide a third input signal as the first set point according to a difference between the third measurement signal and a third set point indicative of a desired temperature of the DUT.

8. A temperature control system for a device under test (DUT), comprising:
   a first channel, connected to a first valve to receive a first air from the first valve;
   a second channel, connected to a second valve to receive a second air from the second valve;
   a heating element, disposed downstream of the first channel and the second channel to heat a mixing of the first air and the second air with an input power to provide a mixing air with a temperature;
   a DUT chamber, disposed downstream of the heating element to receive the mixing air and configured to accommodate the DUT;
   a boost converter, configured to convert an alternating current (AC) power to a direct current (DC) power;
   a first proportional-integral-derivative (PID) controller, configured to provide a first input signal according to a difference between a first measurement signal of the heating element and a first set point, wherein the first measurement signal is indicative of an amount of power consumed by the heating element, and the first set point is indicative of a desired input power to be supplied to the heating element;

at least one switching regulator, coupled to the boost converter to receive the DC power from the converter and coupled to the first PID controller to receive the first input signal, and configured to adjust the input power to the heating element, wherein the at least one switching regulator is configured to adjust the input power according to the first input signal, and wherein the at least one switching regulator includes a plurality of switching regulators, each of the regulators has a different voltage step size and provides a corresponding different output power.

9. The system according to claim 8, wherein a sum of output powers of the plurality of switching regulators is substantially equal to the desired input power to the heating element.

10. A temperature control system for a device under test (DUT), comprising:
a first channel, connected to a first valve to receive a first air from the first valve;
a second channel, connected to a second valve to receive a second air from the second valve;
a heating element, disposed downstream of the first channel and the second channel to heat a mixing of the first air and the second air with an input power to provide a mixing air with a temperature;
a DUT chamber, disposed downstream of the heating element to receive the mixing air and configured to accommodate the DUT;
a boost converter, configured to convert an alternating current (AC) power to a direct current (DC) power;
a first proportional-integral-derivative (PID) controller, configured to provide a first input signal according to a difference between a first measurement signal of the heating element and a first set point, wherein the first measurement signal is indicative of an amount of power consumed by the heating element, and the first set point is indicative of a desired input power to be supplied to the heating element;
at least one switching regulator, coupled to the boost converter to receive the DC power from the converter and coupled to the first PID controller to receive the first input signal, and configured to adjust the input power to the heating element,
wherein the first channel comprises an inner channel and an outer channel, and the first air flows in the outer channel in a first direction and flows in the inner channel in a second direction substantially opposite to the first direction.

11. The system according to claim 10, further comprising a heating channel, disposed downstream of the first channel and the second channel, wherein the heating element is disposed in the heating channel, the first air flows through the outer channel and the inner channel and then flows into the heating channel, and the first air flows in the heating channel in a third direction substantially opposite to the second direction.

12. A temperature control system for a device under test (DUT), comprising:
a first channel, connected to a first valve to receive a first air from the first valve;
a second channel, connected to a second valve to receive a second air from the second valve; and
a heating unit, disposed downstream of the first channel and the second channel, wherein the heating unit comprises a heating element and a mixing chamber, the heating element is located in the mixing chamber, and the heating unit is adapted to heat a mixing of the first air and the second air according to an input power to provide a mixing air with a temperature to a DUT chamber disposed downstream of the heating element;
a control circuit configured to adjust the input power according to a power measurement signal of the heating element and either a desired temperature of the DUT or a desired outlet temperature of the mixing chamber,
wherein the control circuit includes a first proportional-integral-derivative (PID) controller, an outlet temperature sensor, and a second PID controller; the first PID controller is configured to provide a first input signal according to a first measurement signal of the heating element and a first set point, the first measurement signal is indicative of an amount of power consumed by the heating element, and the first set point is indicative of a desired input power to be supplied to the heating element; the outlet temperature sensor is configured to provides a second measurement signal indicative of a current outlet temperature of the mixing chamber; and the second PID controller is configured to provide a second input signal as the first set point according to a difference between the second measurement signal and a second set point indicative of a desired outlet temperature of the mixing chamber.

13. The system according to claim 12, further comprising an electric current sensor and a voltage sensor, wherein the electric current sensor is configured to provide a current sensing signal indicative of a current supplied to the heating element, and the voltage sensor is configured to provide a voltage sensing signal indicative of a voltage applied to the heating element, and wherein the first measurement signal is generated in accordance with the current sensing signal and the voltage sensing signal.

14. The system according to claim 12, further comprising a DUT temperature sensor and a third PID controller, wherein the DUT temperature sensor is configured to provide a third measurement signal indicative of a current temperature of the DUT, and the third PID controller is configured to provide a third input signal as the second set point according to a difference between the third measurement signal and a third set point indicative of the desired temperature of the DUT.

15. A temperature control method of a temperature control system for a device under test (DUT), the method comprising:
receiving a first air from a first valve through a first channel;
receiving a second air from a second valve through a second channel;
disposing downstream of the first channel and the second channel a mixing chamber and disposing a heating element in the mixing chamber;
mixing the first air and the second air to form a mixing air in the mixing chamber;
calculating an input power, by a control circuit, according to a power measurement signal of the heating element and either a desired temperature of the DUT or a desired outlet temperature of the mixing chamber, wherein the control circuit includes a first proportional-integral-derivative (PID) controller, an outlet temperature sensor, and a second PID controller; the first PID controller provides a first input signal according to a first measurement signal of the heating element and a first set point, the first measurement signal is indicative of an amount of power consumed by the heating element, the first set point is indicative of a desired input power to be supplied to the heating element; the outlet temperature sensor provides a second measurement signal indicative of a current outlet temperature of the mixing chamber; and the second PID controller provides a second input signal as the first set point according to a difference between the second measurement signal and a second set point indicative of a desired outlet temperature of the mixing chamber; and heating the mixing air with the input power by applying the input power to the heating element.

* * * * *